(12) United States Patent
Duqi et al.

(10) Patent No.: US 9,975,756 B2
(45) Date of Patent: May 22, 2018

(54) MICRO-ELECTRO-MECHANICAL PRESSURE DEVICE AND METHODS OF FORMING SAME

(71) Applicant: STMICROELECTRONICS S.R.L., Agrate Brianza (IT)

(72) Inventors: Enri Duqi, Milan (IT); Sebastiano Conti, Pregnana Milanese (IT); Lorenzo Baldo, Bareggio (IT); Flavio Francesco Villa, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days. days.

(21) Appl. No.: 15/276,613

(22) Filed: Sep. 26, 2016

(65) Prior Publication Data
US 2017/0247249 A1 Aug. 31, 2017

(30) Foreign Application Priority Data
Feb. 25, 2016 (IT) .......... 102016000019782

(51) Int. Cl.
*G01L 9/00* (2006.01)
*H01L 21/00* (2006.01)
*B81B 7/00* (2006.01)
*B81C 1/00* (2006.01)
*B81B 3/00* (2006.01)

(52) U.S. Cl.
CPC .......... *B81B 7/0038* (2013.01); *B81B 3/0086* (2013.01); *B81C 1/00269* (2013.01); *B81B 2201/0264* (2013.01); *B81B 2203/0127* (2013.01); *B81B 2203/0315* (2013.01); *B81B 2207/012* (2013.01)

(58) Field of Classification Search
CPC .................................................... B81B 7/0038
USPC .................................................. 257/419, 417
See application file for complete search history.

(56) References Cited

U.S. PATENT DOCUMENTS

| | | | |
|---|---|---|---|
| 8,173,513 B2 | 5/2012 | Villa et al. | |
| 9,114,976 B1 * | 8/2015 | Cheng | B81B 7/0054 |
| 9,643,837 B1 * | 5/2017 | Herrmann | B81B 3/0072 |
| 2008/0315333 A1 | 12/2008 | Combi et al. | |

(Continued)

FOREIGN PATENT DOCUMENTS

| | | |
|---|---|---|
| EP | 1577656 A1 | 9/2005 |
| WO | 2007042336 A2 | 4/2007 |

*Primary Examiner* — Igwe U Anya
(74) *Attorney, Agent, or Firm* — Seed Intellectual Property Law Group LLP

(57) ABSTRACT

A micro-electro-mechanical pressure sensor device, formed by a cap region and by a sensor region of semiconductor material. An air gap extends between the sensor region and the cap region; a buried cavity extends underneath the air gap, in the sensor region, and delimits a membrane at the bottom. A through trench extends within the sensor region and laterally delimits a sensitive portion housing the membrane, a supporting portion, and a spring portion, the spring portion connecting the sensitive portion to the supporting portion. A channel extends within the spring portion and connects the buried cavity to a face of the second region. The first air gap is fluidically connected to the outside of the device, and the buried cavity is isolated from the outside via a sealing region arranged between the sensor region and the cap region.

22 Claims, 6 Drawing Sheets

(56) References Cited

U.S. PATENT DOCUMENTS

| | | | | |
|---|---|---|---|---|
| 2010/0001615 A1* | 1/2010 | Steeneken | ............. | B81B 3/0059 |
| | | | | 310/300 |
| 2015/0001651 A1* | 1/2015 | Faralli | ................... | B81B 3/0021 |
| | | | | 257/417 |
| 2016/0370242 A1* | 12/2016 | Duqi | .................... | G01L 9/0054 |
| 2017/0122181 A1* | 5/2017 | Murakami | ................ | F01P 7/16 |
| 2017/0144881 A1* | 5/2017 | Baldo | ................... | B81B 7/0045 |

* cited by examiner

Fig.5A    Fig.5B
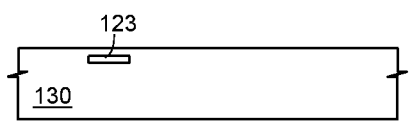
Fig.6A    Fig.6B
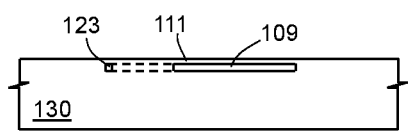
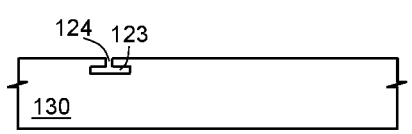
Fig.7A    Fig.7B
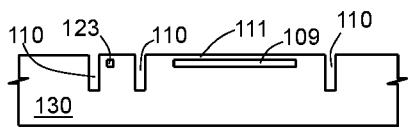
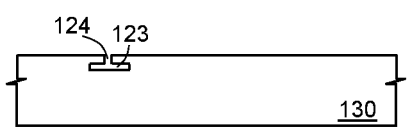
Fig.8A    Fig.8B
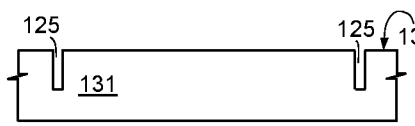
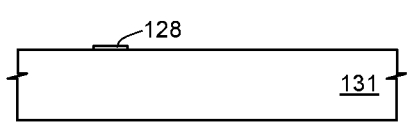
Fig.9A    Fig.9B
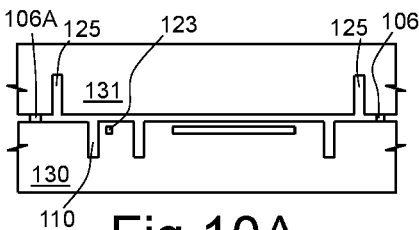
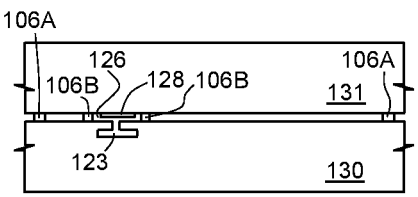
Fig.10A    Fig.10B

MICRO-ELECTRO-MECHANICAL PRESSURE DEVICE AND METHODS OF FORMING SAME

BACKGROUND

Technical Field

The present disclosure relates to a micro-electro-mechanical pressure sensor and methods of forming same.

Description of the Related Art

As is known, sensors including micromechanical structures made, at least in part, of semiconductor materials and with MEMS (Micro-Electro-Mechanical Systems) technology are increasingly used, due to their advantageous characteristics of small dimensions, low manufacturing costs, and flexibility.

A MEMS sensor generally comprises a micro-electro-mechanical structure that transduces a physical or mechanical quantity to be detected into an electrical quantity (for example, correlated to a capacitive variation) and an electronic reading circuit, usually an ASIC (Application Specific Integrated Circuit), which executes processing operations (among which amplification and filtering) of the electrical quantity and outputs an electrical signal, either analog (such as a voltage), or digital (such a PDM—Pulse Density Modulation signal). The electrical signal, in case further processed by an electronic interface circuit, is then made available to an external electronic system, for example a microprocessor control circuit of an electronic apparatus incorporating the sensor.

In micro-electro-mechanical structures, detection of the desired physical or mechanical quantity is obtained by virtue of a membrane formed in or on a semiconductor chip and suspended over a cavity. The membrane may be arranged facing the external environment or be in communication therewith via a fluidic path.

Italian patent application TO2013A000540 filed on 28 Jun. 2013 (which corresponds to U.S. Pat. Pub. No. 2015/001651) describes, for example, an MEMS device, wherein a sensitive part of the device including the membrane is separated from the rest of the chip and supported by springs. The springs decouple the sensitive part from the rest of the chip and absorb the packaging stress, without transferring it to the sensitive part.

FIG. 1 shows in a simplified way an MEMS sensor 1 formed in a chip 10 of semiconductor material, such as silicon, subject of patent application TO2013A000540 referred to above, here illustrated as a pressure sensor. A cap 11 is fixed to a first face 10A of the chip 10 through first spacers 22, and a closing region 12 is fixed to a second face 10B of the chip 10 via second spacers 26.

The chip 10 comprises a suspended region 13 separated from a peripheral portion 18 of the chip 10 through a trench 14. Elastic elements (also referred to as springs 15) support the suspended region 13 and connect it mechanically to the peripheral portion 18. The suspended region 13 forms a membrane 19 delimited at the bottom by a buried cavity 16.

In the pressure sensor of FIG. 1, the membrane is obtained by epitaxial growth in a deoxidizing environment above the buried cavity 16. Consequently, a certain amount of gas (generally, hydrogen) remains within the buried cavity 16. As temperature varies, the trapped gas expands or contracts and may generate a spurious pressure against the membrane. This may cause a reading error, generating an offset.

BRIEF SUMMARY

According to embodiments of the present disclosure, an MEMS device and the corresponding manufacturing method are provided. For instance one embodiment is directed to a micro-electro-mechanical pressure sensor device. The micro-electro-mechanical pressure sensor device includes a first region and a second region of semiconductor material having a first face and a second face. The first region faces and is fixed to the first face of the second region. A first air gap is between the first face of the second region and the first region. A buried cavity is in the second region and a membrane within the second region between the buried cavity and the first face or the second face of the second region. The micro-electro-mechanical pressure sensor device further includes a through trench in the second region that laterally delimits a sensitive portion housing the membrane, a supporting portion and a spring portion. The spring portion couples the sensitive portion to the supporting portion. A channel is in the spring portion. The channel fluidically couples the buried cavity to a first portion of the first face of the second region. The first portion of the first face is fluidically isolated from a second portion of the first face of the second region. The second portion is in fluid communication with an external environment.

One or more embodiments reduce the sensitivity of the MEMS device to temperature variations. For instance in one embodiment, at least some of the gas, such as hydrogen gas, may exit the buried cavity and travel to the first portion of the first face of the second region, which is fluidically isolated from the second portion that faces the membrane. In that regard, the buried cavity will be less likely to expand or contact due to variations in temperature.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 5A-10A, 11, 12 show cross-sections corresponding to FIG. 3, in successive manufacturing steps of the sensor of FIG. 2;

FIGS. 5B-10B show cross-sections corresponding to FIG. 4, for the same manufacturing steps as FIGS. 5A-10A;

DETAILED DESCRIPTION

Figure 1:
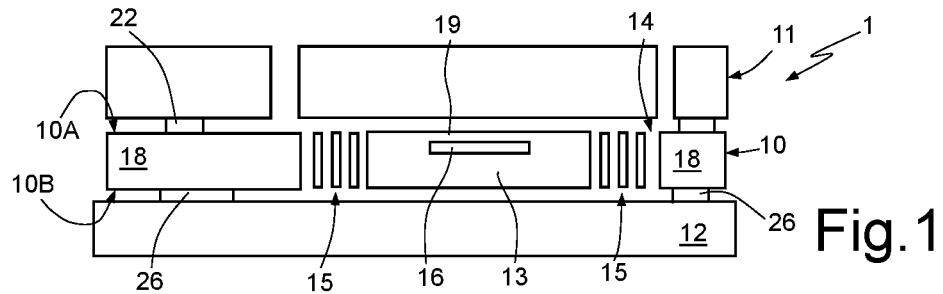
FIG. 1 is a cross-section of a known MEMS pressure sensor.
Figure 2:
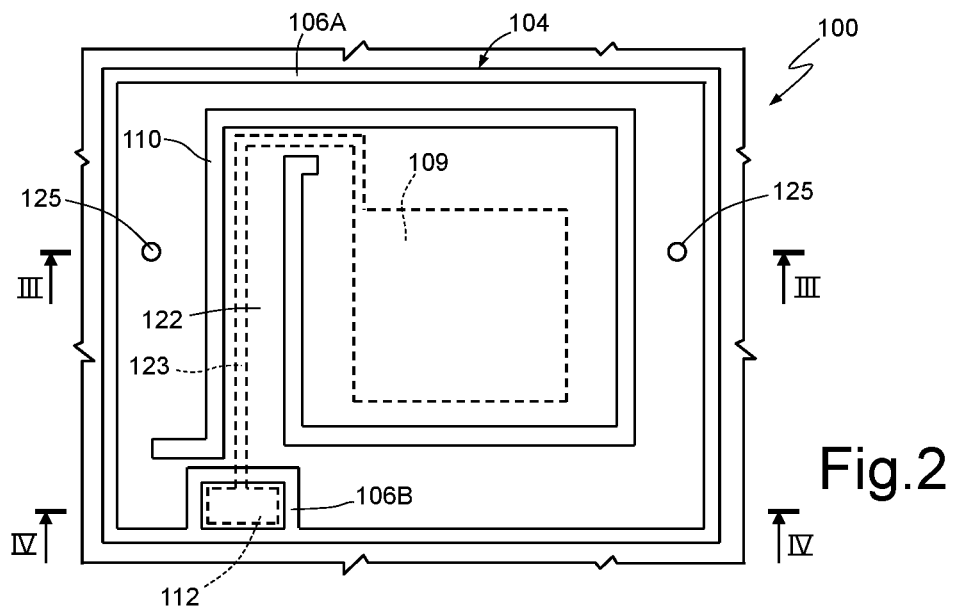
FIG. 2 is a top plan view, with ghost parts, of an embodiment of the present pressure sensor.
Figure 3:
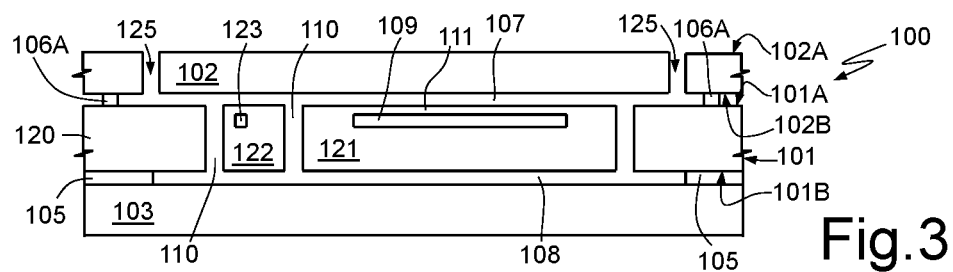
FIG. 3 is a cross-section of the pressure sensor of FIG. 2, taken along section plane III-III.
Figure 4:
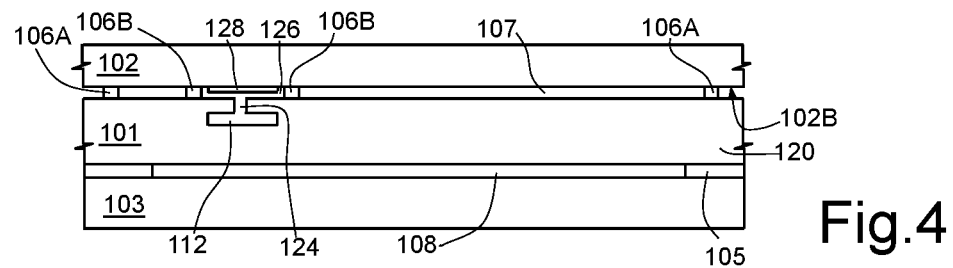
FIG. 4 is a cross-section of the pressure sensor of FIG. 2, taken along the section plane IV-IV.

FIGS. 2-4 illustrate an embodiment of a pressure sensor 100 made according to MEMS technology. The pressure sensor 100 comprises a sensor region 101 having a first face 101A and a second face 101B. The pressure sensor 100 further comprises a first cap region 102 facing the first face 101A of the sensor region 101 and a second cap region 103 facing the second face 101B of the sensor region 101. The first cap region 102 is bonded to the first face 101A of the sensor region 101 by a first bonding structure 104, and the second cap region 103 is bonded to the second face 101B of the sensor region 101 by a second bonding structure 105. The first bonding structure 104 is formed by a perimetral region 106A and by a sealing region 106B, which here in part coincide but could be completely distinct. The perimetral region 106A and sealing region 106B have a closed shape, for the reasons explained hereinafter, and also form spacers. The bonding structures 104, 105 may, for example, be of a thermo-compressive material such as gold, a eutectic material such as aluminum-germanium, tin, copper, a polymeric material or glass-frit-based material.

A first air gap 107 extends between the first face 101A of the sensor region 101 and the first cap region 102 there extends, and a second air gap 108 extends between the second face 101B of the sensor region 101 and the second cap region 103.

A trench 110 extends within the sensor region 101, between the first air gap 107 and the second air gap 108, fluidically connecting them. The trench 110 has a square spiral shape with five sides and delimits a supporting portion 120 external thereto, a sensitive portion 121 inside it, and a spring portion 122 that connects the supporting portion 120 to the sensitive portion 121. In this way, the sensitive portion 121 is accommodated in a chamber formed by the first air gap 107, the second air gap 108 and the trench 110 and is free to move, being mechanically uncoupled from the supporting portion 120.

The sensitive portion 121 forms a membrane 111 delimited at the bottom by a buried cavity 109. The membrane 111 is between the buried cavity 109 and the first air gap 107 and faces the first cap region 102.

As illustrated in the sections of FIGS. 3-4, and, with a dashed line, in the top plan view of FIG. 2 (where, for clarity, the first cap region 102 is illustrated as a ghost region in dashed lines), a channel 123 extends within the spring region 122, between the buried cavity 109 and a well 112 formed in the supporting region 120. In turn, the well 112 is connected to the first air gap 107 by an opening 124, extending through the sensor region 101 between the first face 101A of the sensor region 101 and the well 112 (see, in particular FIG. 4). As may be noted from FIGS. 2 and 4, the sealing region 106B extends above the well 112 and surrounds the opening 124, delimiting a chamber 126 that is thus in communication with the well 112 and isolated from the first air gap 107 by the sealing region 106B.

The buried cavity 109, the channel 123, and the well 112 are formed on a same level, underneath the first face 101A of the sensor region 101, have approximately the same height and are obtained simultaneously, as explained in detail hereinafter.

As shown in FIGS. 2 and 3, the first cap region 102, which has an outer face 102A and an inner face 102B, has at least one communication hole, here two communication holes 125, which extend between the outer face 102A and the inner face 102B of the first cap region 102. The communication holes 125 fluidically connect the first air gap 107 to the environment external to the pressure sensor 100 and thus expose the membrane 111 to the external pressure, enabling detection thereof, in a per se known manner.

A getter region 128 extends on the inner face 102B of the first cap region 102, facing the chamber 126. The getter region 128 is formed by a thin layer of metal, for example barium, indium, magnesium, calcium, or sodium, having the aim of trapping possible residual gases released during bonding the first cap region 102 to the sensor region 101.

Hereinafter, the present manufacturing method will be described to form a single sensitive structure, however it is understood that this structure is replicated a number of times in a wafer, prior to dicing, in a per se known manner to a person skilled in the art.

The pressure sensor 100 of FIG. 2 is manufactured starting from a first wafer 130, shown in FIGS. 5A-5B, of semiconductor material, for example monocrystalline silicon. As shown in FIGS. 6A-6B, the buried cavity 109, the channel 123, and the well 112 are formed in the first wafer 130, for example using the manufacturing process described in EP1577656 (corresponding to the U.S. Pat. No. 8,173, 513). This process comprises forming a plurality of trenches, of appropriate depth, shape, and width, followed by an epitaxial growth in reducing environment. In this way, a silicon layer grows on the first wafer 130, closing the trenches at the top and forming the membrane 111. Thermal annealing is carried out, which causes migration of silicon atoms that tend to move into a position of lower energy. In this way, the buried cavity 109, the channel 123, and the well 112 are formed, all buried and covered by a silicon layer that also forms the membrane 111. If provided, a further epitaxial growth is carried out, until a desired thickness is reached for the membrane 111.

With reference to FIGS. 7A-7B, via a masking and etching step, the opening 124 is formed and fluidically connects the buried cavity 109 to the outside of the first wafer 130 through the well 112 and the channel 123.

With reference to FIGS. 8A, 8B, using a masking layer (not illustrated), a deep silicon etch is carried out in the first wafer 130, thus forming the trench 110, here still blind, external to and surrounding the buried cavity 109. According to an alternative embodiment, the step of FIG. 8 may be carried out prior to the steps of FIGS. 7A and 7B, i.e., it is possible to form first the trench 110 and the opening 124, using a non-liquid resist, for example a roller type, as mask for the opening 124.

With reference to FIGS. 9A, 9B, a second wafer 131 of semiconductor material, for example monocrystalline silicon, is etched for forming the communication holes 125, which are still blind. Furthermore, the getter regions 128 are formed on the face 131B of the second wafer 131 to be bonded to the first wafer 130, by depositing and defining a layer of suitable material.

As illustrated in FIGS. 10A and 10B, the second wafer 131 is flipped over and bonded to the first wafer 130, on the side of the membrane 111, by the first bonding structure 106. In this way, as mentioned, the perimetral region 106A delimits the first air gap 107, and the sealing region 106B surrounds the opening 124 and defines the chamber 126, above the opening 124.

Bonding the second wafer 131 to the first wafer 130 is made in vacuum so that the buried cavity 109, the channel 123, the well 112, the opening 124, and the chamber 126 remain in vacuum conditions. In this step, the getter region 128 absorbs residual gases due to bonding, further reducing the pressure in the buried cavity 109.

Figure 11:
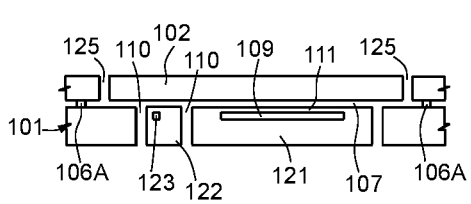

With reference to FIG. 11, the first wafer 130 and the second wafer 131 are thinned out. In particular, thinning of the first wafer 130 is carried out on the exposed side until reaching the bottom of the trench 110, which thus becomes a through trench, and thinning of the second wafer 131 is carried out on the exposed side until reaching the bottom of the communication holes 125, which thus become through holes. In this way, the sensor region 101 and the first cap region 102 are formed; further, the trench 110 extends throughout the thickness of the sensor region 101, and the communication holes 125 connect the first air gap 107 to the external environment.

Figure 12:
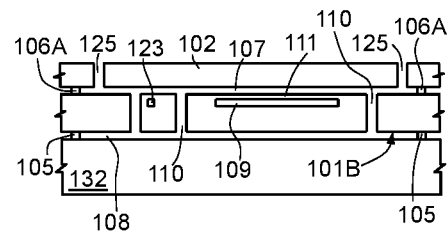

A third wafer 132 of semiconductor material, for example monocrystalline silicon, is bonded to the second face 101B of the sensor region 101, as illustrated in FIG. 12, through the second bonding layer 105, thus defining the second air gap 108 between the sensor region 101 and the third wafer 132. The third wafer 132 is thinned out, thus forming the second cap region 103.

In this way, the gas trapped in the buried cavity 109 (as well as in the channel 123 and in the well 112) during epitaxial growth may exit through the opening 124. Further, during bonding, performed in vacuum conditions, any possible gas that has remained is evacuated. The sealing region 106 maintains the vacuum within the buried cavity 109 as well as in the channel 123 and in the well 112 also subsequently, while the communication holes 125 fluidically connect the first air gap 107 with the external environment, enabling detection of the external pressure. In this way, the linearity of pressure detection improves considerably, thereby any possible compensation by the ASIC that processes the signal supplied by the pressure sensor becomes simpler and the testing time is reduced.

With the described pressure sensor, it is possible to reduce the thickness of the passivation that covers the membrane 111. In this way, an increase of sensitivity is obtained.

Figure 13:
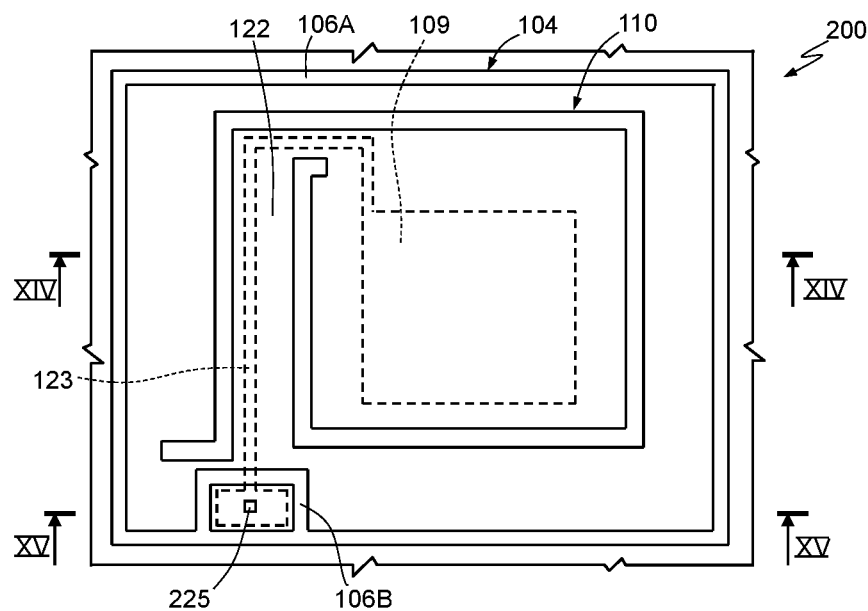
FIG. 13 is a top plan view, with ghost parts, of a different embodiment of the present pressure sensor.
Figure 14:
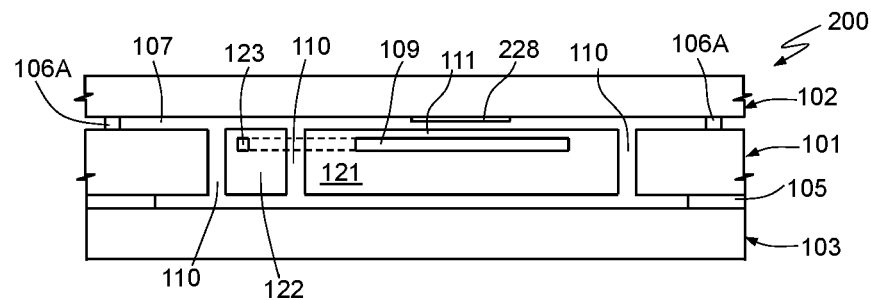
FIG. 14 is a cross-section of the pressure sensor of FIG. 13, taken along section plane XIV-XIV.
Figure 15:
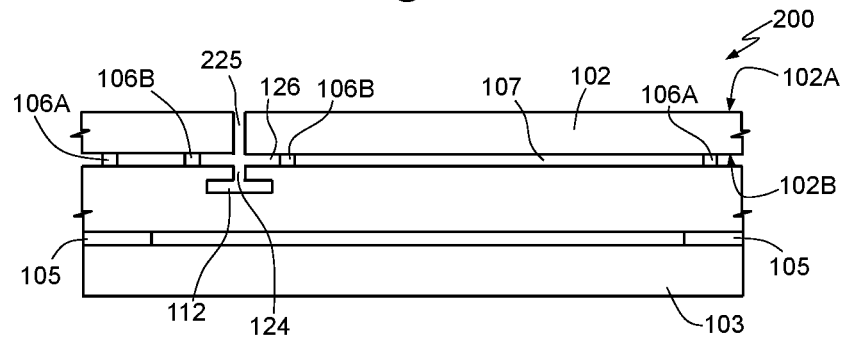
FIG. 15 is a cross-section of the pressure sensor of FIG. 13, taken along the section plane XV-XV.

According to a different embodiment, FIGS. 13-15, the first cap region 102 has a communication hole 225, extending between the outer face 102A and the inner face 102b of the first cap region 102. Furthermore, no through holes connect the first air gap 107 or the second air gap 108 to the environment external to the pressure sensor. In FIGS. 13-15, the communication hole 225 is arranged above the opening 124 and the well 112 and connects the outside of the pressure sensor, designated by 200, to the chamber 126 and to the buried cavity 109. The latter is thus fluidically connected to the environment surrounding the pressure sensor 200. Instead, since no communication holes connect the first air gap 107 to the outside, the buried cavity 109 is isolated from the surrounding environment by a sealing region 106b. Consequently, in this embodiment, the first air gap 107 is in vacuum conditions as a result of the bonding of the second wafer 131. The membrane 111 is thus also exposed to the external pressure on a first side (the underside in FIG. 14) and at an extremely low pressure (vacuum) on a second side (the upper side in FIG. 14), and is thus able to work in a way similar to the embodiment of FIGS. 2-4.

In the embodiment of FIGS. 13-15, the getter region (designated by 228 in FIG. 14) is arranged facing the air gap 107.

The pressure sensor 200 of FIGS. 13-15 is manufactured similarly to the pressure sensor 100 of FIGS. 2-4, except as regards perforation of the second wafer 131 (FIG. 9). In fact, for the pressure sensor 200, a communication hole is formed, intended to be vertically aligned to the chamber 126 and to the opening 124, and thus within the area defined by the sealing region 106b, instead of above the first air gap 107.

The pressure sensor 100, 200 described herein enables solution of the problem of the gas trapped in the buried cavity 109 during formation thereof. In fact, in the pressure sensor 100 of FIGS. 2-4, the buried cavity 109 is under vacuum, as explained above and thus the offset problem explained above is not present.

In the pressure sensor 200 of FIGS. 13-15, instead, the communication hole 225 connects the external environment fluidically to the buried cavity 109, whereas the sealing region 106 isolates the first air gap 107, which is under vacuum. Also in this case, thus, no gases are trapped in a cavity in contact with the membrane 111, which might falsify reading of the external pressure.

Finally, it is clear that modifications and variations may be made to the device and to the manufacturing method described and illustrated herein, without thereby departing from the scope of the present disclosure.

Figure 16:
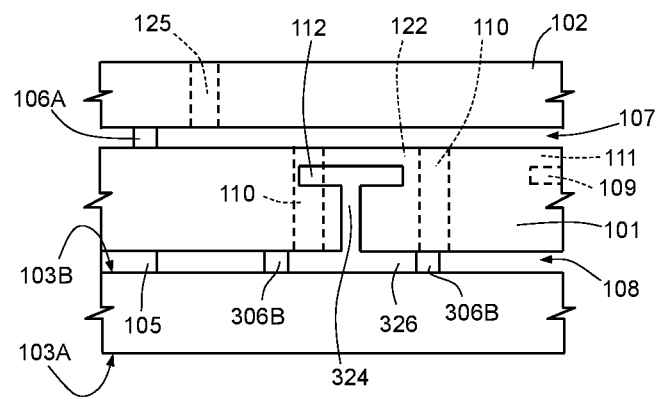
FIGS. 16-20 show details in cross-section of variants of the present pressure sensor.
Figure 17:
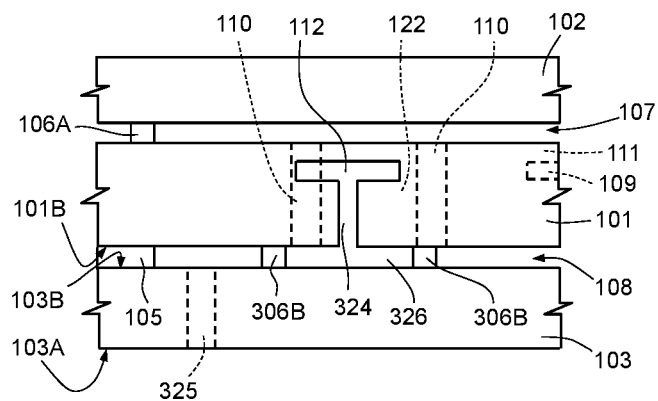

For instance, FIGS. 16 and 17 show variants of the pressure sensor 100 of FIGS. 2-4. In FIGS. 16 and 17, the opening that connects the buried cavity 109, the channel 123, and the well 112 to the outer surface of the sensor region 101 in order to create the vacuum during bonding of the first wafer 130, designated by 324, extends between the well 112 and the second face 101B of the sensor region 101. Furthermore, the sealing region, designated by 306B, is formed between the sensor region 101 and the inner face 103B of the second cap region 103, for example as part of the second sealing structure 105, and surrounds a chamber 326, formed between the sensor region 101 and the second cap region 103. In this way, the vacuum in the buried cavity 109 is set up during bonding of the third wafer 132 to the first wafer 130.

Figure 18:
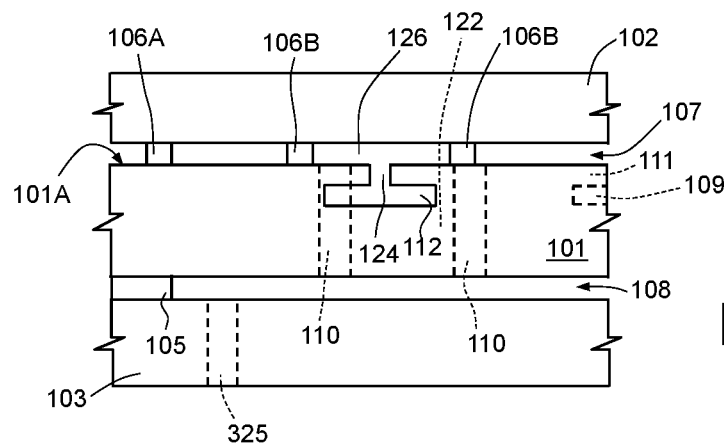

Furthermore, as shown in FIGS. 17 and 18, the communication holes that connect the first air gap 107 in the pressure sensor 100 may be formed in the second cap region 103, instead of in the first cap region 102. Here, one or more communication holes 325 (represented with dashed lines, in so far as they are not visible in the cross-section of these figures) extend between an outer face 103A and an inner face 103B of the second cap region 103 and connect the membrane 111 to the outside, since the trench 110 (which is also represented by a dashed line) connects together fluidically the first and second air gaps 107, 108. In particular, FIG. 17 refers to an embodiment with an opening 324 extending between the well 112 and the second face 101B of the sensor region 101 and with a communication hole or holes 325, extending through the second cap region 103. FIG. 18 refers to an embodiment with an opening 124 extending between the well 112 and the first face 101A of the sensor region 101 and with a communication hole or holes 325 extending through the second cap region 103.

Figure 19:
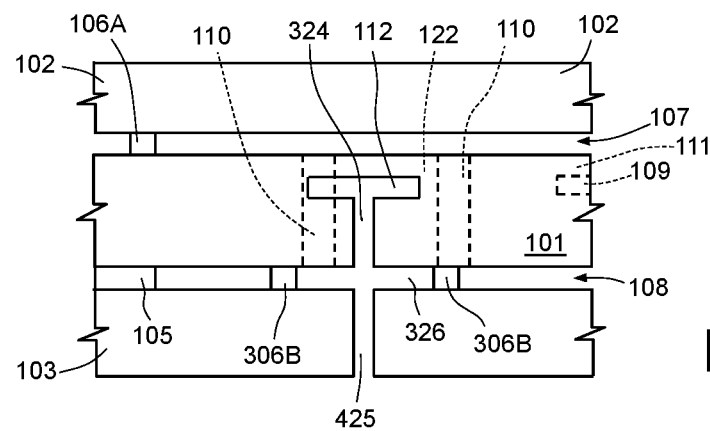

Furthermore, the sensor 200 of FIGS. 13-15 may be modified so as to connect the buried cavity 109 to the outside through the second cap region 103 through an opening 324 (extending between the well 112 and the second face 101B of the sensor region 101), a chamber 326 (formed between the sensor region 101 and the second cap region 103), and a communication hole 425 (in the second cap region 103), as illustrated in the detail of FIG. 19.

The number of communication holes 125, 225, 325, 425 may vary.

Figure 20:
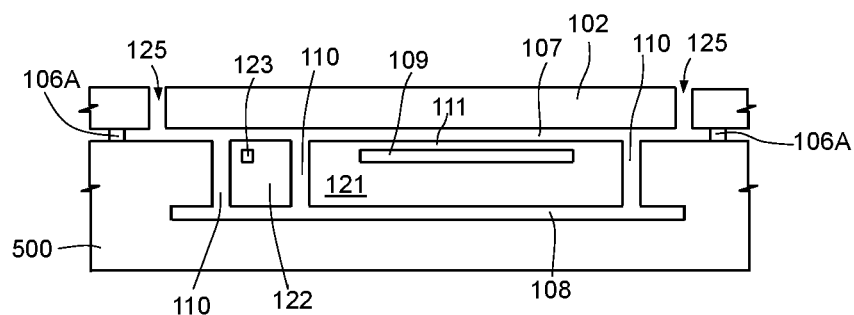

Finally, it is possible to form the second monolithic cap region 103 together with the sensor region 101, forming the second air gap 108 with the same process used for the buried cavity 109, before forming the latter, in the embodiments of FIGS. 2-4, 13-15, and 18. For instance, FIG. 20 shows a single substrate 500 forming the sensor region 101 and the second cap region 103. Here, the air gap 107 is connected to the outside, as in the embodiment of FIGS. 3-5. Similar variants are possible for the embodiments of FIGS. 13-15 and 18.

As an alternative and in a dual way, it is possible to form the first monolithic cap region 102 together with the sensor region 101, forming the first air gap 107 with the process used for the buried cavity 109, in the embodiments of FIGS. 16, 17, and 19.

In this way, the pressure sensor may be manufactured with a smaller number of wafers than currently, since the first or the second air gap 107, 108 are formed in a same monolithic substrate, without bonding of two wafers.

Figure 21:
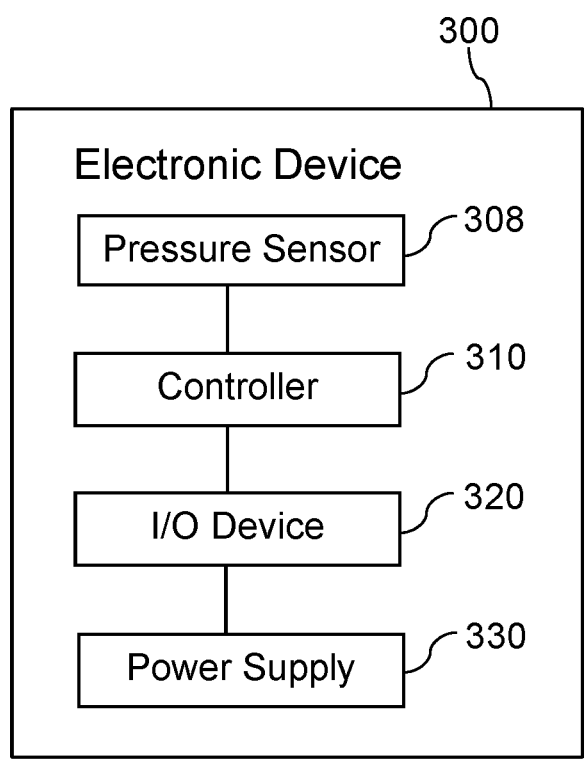
FIG. 21 is a block diagram of an electronic device comprising a pressure sensor in accordance with one embodiment.

FIG. 21 is a block diagram of an electronic device 300 comprising a pressure sensor 308, such as the pressure sensors 100, 200. The electronic device 300 may be a mobile communications apparatus, such as a mobile phone and a personal digital assistant, a laptop, a desktop computer, a camera or video device including a network video, a vehicle component, such as a vehicle parking sensor, a wearable device, such as a smartwatch, or any other electronic device. The electronic device 300 includes a controller 310 coupled to the pressure sensor 308. The controller 310 includes control circuitry, which may include one or more processors, memory, and discrete logic. The controller 310 is configured to transmit signals to the pressure sensor 308 and receive signals from the pressure sensor 308. The electronic device may further include an input/output device 320, for example, a keyboard or a display that is coupled to the controller. The electronic device may further include a power supply 330, which may be a battery or components for coupling to an external power source.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-electro-mechanical pressure sensor device, comprising:
   a first region;
   a second region of semiconductor material having a first face and a second face, the first region facing and fixed to the first face of the second region;
   a first air gap between the first face of the second region and the first region;
   a buried cavity in the second region;
   a membrane within the second region between the buried cavity and the first face of the second region;
   a through trench in the second region, the through trench laterally delimiting a supporting portion, a spring portion, and a sensitive portion housing the membrane, the spring portion coupling the sensitive portion to the supporting portion; and
   a channel in the spring portion, the channel fluidically coupling the buried cavity to a first portion of the first face of the second region, the first portion of the first face being fluidically isolated from a second portion of the first face of the second region, the second portion of the first face forming a surface of the membrane, the first portion of the first face being in fluid communication with an external environment.

2. The device according to claim 1, comprising a sealing region that fluidically isolates the first portion of the first face of the second region from the second portion of the first face of the second region.

3. The device according to claim 2, wherein the channel extends at distance from the first face of the second region, and an opening extends in the first portion of the first face of the second region and between the first face and the channel, the sealing region having a closed shape surrounding a chamber between the first and second regions and fluidically coupled to the opening.

4. The device according to claim 3, wherein the first region has an outer face and an inner face, the inner face facing the second region, and wherein at least one through hole extends between the inner face and the outer face of the first region outside the chamber and connects the first air gap with the outer face of the first region.

5. The device according to claim 3, further comprising a third region facing the second face of the second region and a second air gap between the second face of the second region and the third region, wherein the third region has an outer face and an inner face, the inner face facing the second region, and wherein at least one through hole extends from the inner face to the outer face of the third region and ends at the second air gap and connecting the second air gap with the outer face of the second region.

6. The device according to claim 3, wherein the first region has an outer face and an inner face, the inner face facing the second region, and wherein a through hole extends between the outer face and the inner face of the first region, inside the sealing region, the first air gap being fluidically isolated from the through hole by the sealing region.

7. The device according to claim 2, wherein the first region and the second region are bonded together through a bonding structure including the sealing region and delimiting the first air gap.

8. The device according to claim 1, further comprising:
   a third region facing a second face of the second region and a second air gap between the second face of the second region and the third region,
   wherein the third region and the second region are bonded together via a bonding layer delimiting the second air gap.

9. The device according to claim 1, further comprising a third region of semiconductor material and monolithic with the second region, and a second air gap between the second region and the third region.

10. The device according to claim 1, comprising a getter region on the first region facing one of the first and second portions of the first face that is not in fluid communication with the external environment.

11. A process for manufacturing a micro-electro-mechanical pressure sensor device, the process comprising:
    forming a buried cavity in a first body of a semiconductor material, the buried cavity delimiting a membrane at a first face of the first body, wherein forming the buried cavity includes forming an open channel in the first body;
    forming, within the first body, a trench, the trench delimiting a sensitive portion including the buried cavity, a supporting portion, and a spring portion, wherein the spring portion couples the sensitive portion to the supporting portion, the spring portion including a channel that fluidically couples the buried cavity to a first portion of the first face of the first body, wherein the open channel is formed simultaneously with the channel of the spring portion; and
    bonding a second body to the first face of the first body to form a first air gap over the membrane, wherein bonding the second body to the first face of the first body comprises forming a sealing structure that fluidically isolates the first portion of the first face of the first body from a second portion of the first face of the first body.

12. The process according to claim 11, wherein forming the sealing structure comprises forming a sealing region between the first face of the first body and the second body.

13. The process according to claim 11, comprising forming a fluidic path comprises forming at least one through hole in the second body outside the sealing region and in fluidic communication with the first air gap.

14. The process according to claim 11, wherein forming the sealing structure comprises simultaneously forming a bonding region delimiting the first air gap.

15. The process according to claim 11, comprising bonding a third body to a second face of the first body and forming a second air gap between the second face of the first body and a face of the third body, wherein bonding the third body comprises forming a bonding layer delimiting the second air gap.

16. A process for manufacturing a micro-electro-mechanical pressure sensor device, the process comprising:
    forming a buried cavity in a first body of a semiconductor material, the buried cavity delimiting a membrane at a first face of the first body;
    forming, within the first body, a trench, the trench delimiting a sensitive portion including the buried cavity, a supporting portion, and a spring portion, wherein the spring portion couples the sensitive portion to the supporting portion, the spring portion including a channel that fluidically couples the buried cavity to a first portion of the first face of the first body;
    bonding a second body to the first face of the first body to form a first air gap over the membrane, wherein bonding the second body to the first face of the first body comprises forming a sealing structure that fluidically isolates the first portion of the first face of the first body from a second portion of the first face of the first body, wherein forming the sealing structure comprises forming a sealing region between the first face of the first body and the second body; and
    forming at least one opening in the first body from the first face to the channel of the spring portion, the sealing region having a closed shape surrounding the at least one opening.

17. The process according to claim 16, wherein forming the buried cavity includes forming an open channel in the first body, wherein forming the open channel includes forming the channel of the spring portion simultaneously.

18. The process according to claim 16, wherein the at least one opening is inside the sealing region and in fluidic connection with the channel and the buried cavity.

19. An electronic device comprising:
    a controller; and
    a pressure sensor coupled to the controller, the pressure sensor including:
        a body of semiconductor material having a first face, a buried cavity, the buried cavity and the first face forming a membrane;
        a through trench in the body, the through trench delimiting a sensitive portion housing the membrane and a spring portion, the spring portion coupling the sensitive portion to a supporting portion; and
        a channel in the spring portion, the channel fluidically coupling the buried cavity to a first portion of the first face of the body, the first portion of the first face being fluidically isolated from a second portion of the first face of the body that forms a surface of the membrane, the second portion being in fluid communication with an external environment.

20. The electronic device according to claim 19, wherein the through trench is spiral shaped.

21. The electronic device according to claim 19, further comprising a cover region spaced apart from the first face of the body by a gap, the cover region having at least one through hole, the second portion of the first face of the body being in fluid communication with the external environment by the at least one through hole.

22. The electronic device according to claim 19, wherein the body is a first body, wherein the cover region is a second body that is coupled to the first face of the first body by the gap.

* * * * *